(12) United States Patent
Bol et al.

(10) Patent No.: US 6,294,445 B1
(45) Date of Patent: Sep. 25, 2001

(54) SINGLE MASK PROCESS FOR MANUFACTURE OF FAST RECOVERY DIODE

(75) Inventors: Igor Bol, Sherman Oaks; Iftikhar Ahmed, Bellflower, both of CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/510,753

(22) Filed: Feb. 22, 2000

(51) Int. Cl.[7] ................................................... H01L 21/28
(52) U.S. Cl. ........................ 438/534; 438/555; 438/688; 438/739; 438/571
(58) Field of Search ..................... 438/534, 555, 438/571, 688, 739, 328, 237, FOR 335, FOR 415

(56) References Cited

U.S. PATENT DOCUMENTS

| | | | |
|---|---|---|---|
| 3,639,186 | * | 2/1972 | Forster et al. . |
| 4,035,907 | * | 7/1977 | Allen et al. . |
| 4,670,090 | * | 6/1987 | Sheng et al. . |
| 4,849,376 | * | 7/1989 | Balzan et al. . |
| 5,160,408 | * | 11/1992 | Long . |
| 5,895,260 | * | 4/1999 | Bhatnagar et al. . |
| 5,915,179 | * | 6/1999 | Etou et al. . |
| 6,221,688 | * | 4/2001 | Fujihira et al. . |

* cited by examiner

*Primary Examiner*—George Fourson
*Assistant Examiner*—Michelle Estrada
(74) *Attorney, Agent, or Firm*—Ostrolenk, Faber, Gerb & Soffen, LLP

(57) ABSTRACT

A single mask process for manufacture of a FRED employs a thick oxide layer over an N type silicon surface and a thin nitride layer over the oxide. A single mask defines FRED device spaced P diffusions. The oxide spanning the P diffusions is laterally etched away, under the nitride layer to expose the surface of adjacent P diffusions and the spanning N type silicon surface. All nitride is then removed and a top contact layer of aluminum is applied atop the silicon surface, contacting a P guard ring diffusion; the surface of the P diffusions defining PN junctions; and the top of the N silicon to define a Schottky diode contact.

17 Claims, 7 Drawing Sheets

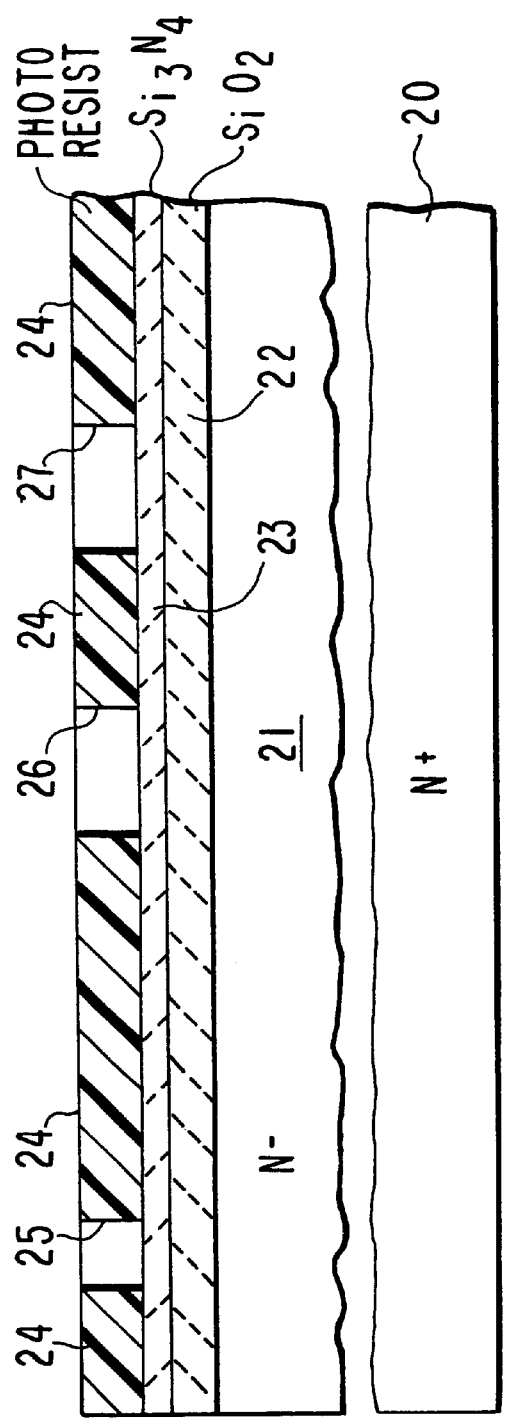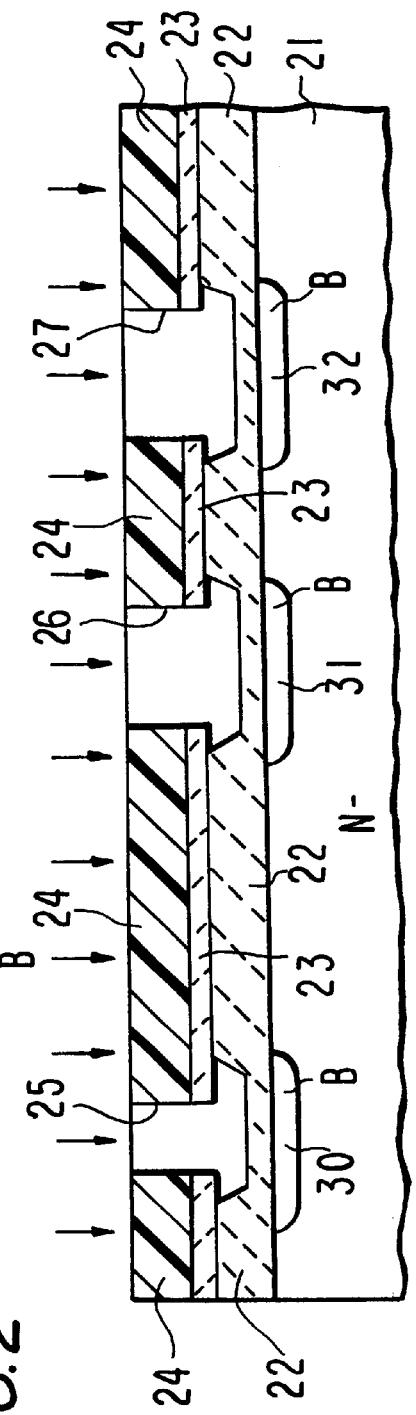

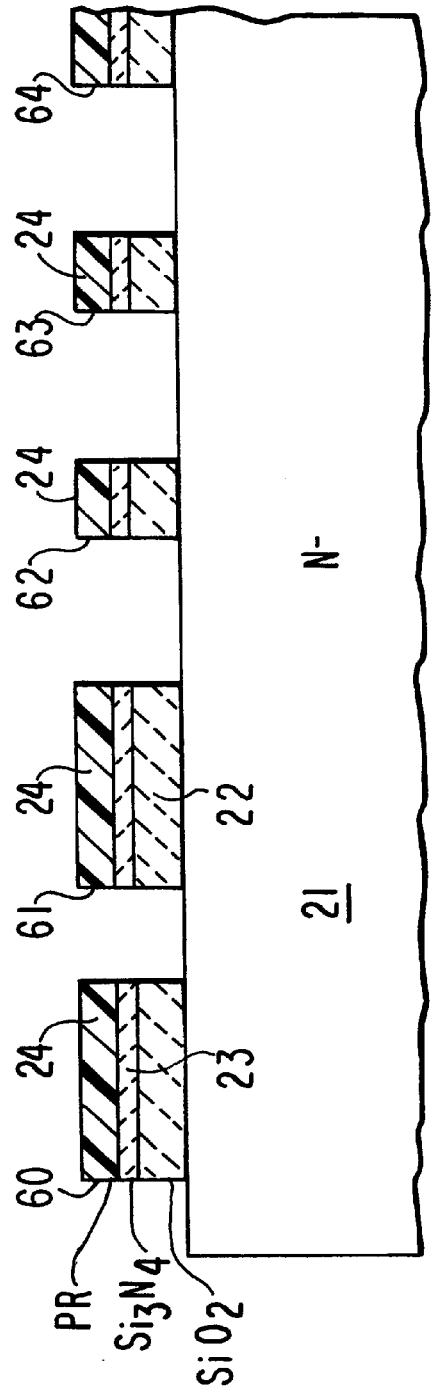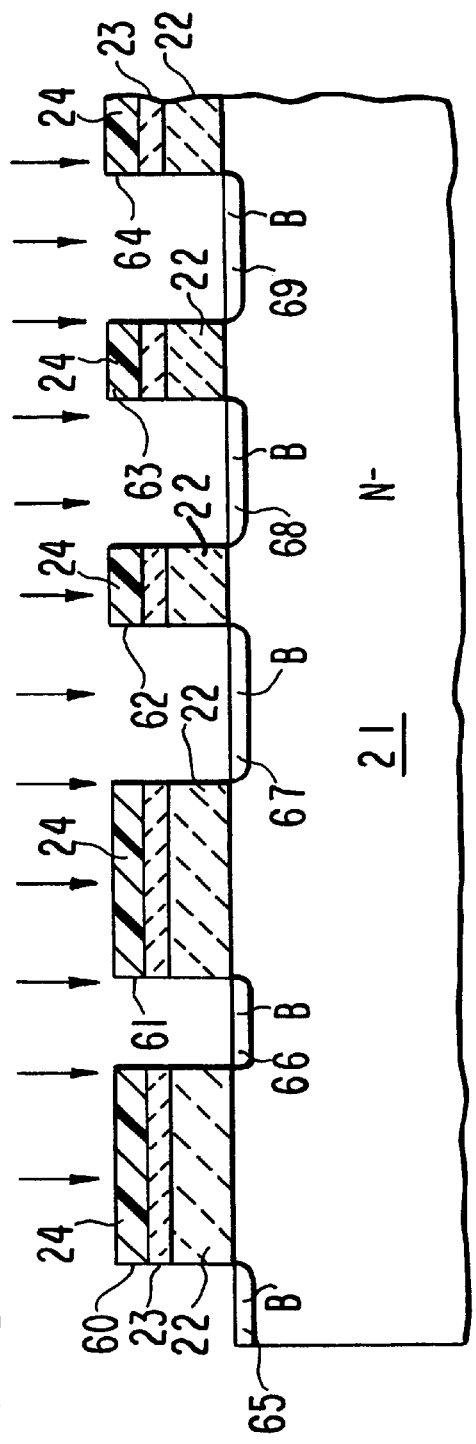

SINGLE MASK PROCESS FOR MANUFACTURE OF FAST RECOVERY DIODE

RELATED APPLICATIONS

This application is related to:

1. Application Ser. No. 09/510,614 filed Feb. 22, 2000 entitled "MANUFACTURING PROCESS AND TERMINATION STRUCTURE FOR FAST RECOVERY DIODE" in the names of Igor Bol and Iftikhar Ahmed (IR1592);
2. Application Ser. No. 09/510,406 filed Feb. 22, 2000 entitled "HIGH VOLTAGE FAST RECOVERY DIODE WITH AMORPHOUS SILICON LAYER" in the names of Igor Bol and Iftikhar Ahmed (IR1691);
3. Application Ser. No. 09/510,613 filed Feb. 22, 2000 entitled "HIGH VOLTAGE TERMINATION WITH AMORPHOUS SILICON LAYER BELOW THE FIELD PLATE" in the name of Iftikhar Ahmed (IR1692); and
4. Application Ser. No. 09/510,752 filed Feb. 22, 2000 entitled "ULTRA LOW $I_{rr}$ FAST RECOVERY DIODE" in the name of Iftikhar Ahmed (IR1693).

FIELD OF THE INVENTION

This invention relates to semiconductor devices and processes for their manufacture and more specifically relates to reduced mask processes and termination structures for such devices.

BACKGROUND OF THE INVENTION

Semiconductor devices, for example, fast recovery diodes ("FRED"s) are well known and are a hybrid of Schottky diodes and PN diodes. This arrangement produces a lower forward voltage drop at higher current, along with a higher switching speed than is available in only a PN junction diode or only a Schottky diode. In the present manufacture of such FRED devices, a plurality of spaced P diffusions of any desired topology are formed in an N type wafer. A contact layer of aluminum overlies the full upper surface of the silicon, except for a termination area. PN junction diodes are then formed where the aluminum contacts the surface of a P diffusion and a Schottky diode is formed where the aluminum contacts the N silicon surface between spaced P diffusions.

The topology of the P diffusion can be spaced polygonal annuli, stripes, or the like. The periphery of the die is then surrounded by a termination region.

The manufacturing process for such FREDs has been complicated by a need for 3, 4, 5 or 6 mask steps during the processing of the device. These mask steps are used to define the termination pattern, the P diffusion pattern and the final metallization pattern. The use of a large number of mask steps increases the cost of the final device and is a source of device defects.

It would be desirable to provide a manufacturing process for a FRED and its termination which uses fewer mask steps without sacrificing device quality. It is also desirable to be able to provide a novel terminal structure for any semiconductor device which provides increased breakdown voltage without the need for a large number of mask steps.

BRIEF DESCRIPTION OF THE INVENTION

In accordance with a first aspect of the invention, a FRED device is manufactured with a single mask step. Thus, an N type wafer is provided and a layer of $SiO_2$ (hereinafter silicon dioxide, or oxide), followed by a layer of $Si_3N_4$ (hereinafter silicon nitride or nitride) is formed atop the wafer. A single mask is used to etch openings in the oxide and nitride layers, having the patterns of spaced P type diffusions to be formed in the silicon for both a termination diffusion and for a PN junction. A P type dopant, for example, boron is then implanted through these windows and is driven into the silicon. The oxide overlying the sides of the diffused regions and under the nitride layer is then etched away thus lifting the nitride layer lattice. A contact metal, for example, aluminum, is then deposited on and overlies the full active surface and the termination surface. The metal then contacts the P diffusions in the active area and the silicon between the spaced diffusions in the active area, thereby defining PN junctions and Schottky diodes in parallel with one another.

The wafer is then subject to a backgrind and to back metal evaporation and to a forming gas anneal.

Note that the entire process above for producing the FRED employs only a single mask. No metal mask is used and the wafer is subsequently sawn to singulate the die.

A novel field plate structure for device termination is also provided which is applicable to FREDs as well as other devices. In general, all high voltage semiconductor devices use field plate structures to obtain the highest possible device breakdown voltage for a given termination structure design. The field plate structures do not conduct device currents and hence have negligible impact on other device parameters such as forward voltage drop during device operation. Thus, in general, a thin layer of high resistivity amorphous silicon is deposited on top of the final metallization to evenly distribute the electric field across the termination structure. This results in a stable field termination structure and improves yield. The amorphous silicon is etched away from the pad area by an additional mask step at the end of the process.

However, the amorphous silicon can be left in place and wire bonds to the underlying aluminum contact can be made through the amorphous silicon without added tooling.

Still further, it has been found that the amorphous silicon can be placed below the metal to avoid the pad mask, producing a new type of FRED with the amorphous silicon layer between the Schottky structure and the single crystal silicon with state of art FRED characteristics.

While this termination is very useful with a FRED structure it can be used in any kind of device such as the termination for a power MOSFET or IGBT.

As a still further feature of the invention, palladium metal can be used in place of aluminum to reduce the $I_{rr}$ of the device. More specifically, during the operation of a FRED device, stored charge produced by injected minority carriers from the PN junctions must be removed after turn off. Removal of stored charge determines the switching characteristics of the FRED device, including switching speed and "softness". A large stored charge also exerts excessive electrical stress during turn off and should be as low as possible. Consequently, device improvement can be obtained by controlling the injection of majority carriers during operation. A novel palladium Schottky structure is used in place of an aluminum Schottky structure since it will require a different current density to turn on the PN junction because of the lower Schottky barrier height of the palladium Schottky compared to the aluminum Schottky always used in a FRED device. That is, the Schottky contact of the FRED conducts until there is a 0.7 volt drop to cause the PN junction to conduct. It has a dramatic impact on the stored charge injected in the device during device operation.

More generally, this aspect of the invention uses a lower barrier height material than aluminum for the Schottky portion of a FRED device to control the switching speed, softness and $I_{rr}$ (stored charge) of the device.

BRIEF DESCRIPTION OF THE DRAWING(S)

FIG. 1 is a cross-section of a small portion of a die within a wafer at the process step in which a single mask is applied to the wafer.

FIG. 2 shows the structure of FIG. 1 after the opening of windows in the oxide/nitride coating atop the silicon and after a boron implant.

FIGS. 6A to 6F show the steps for making an improved termination for the FRED structure of FIGS. 1 to 6.

DETAILED DESCRIPTION OF THE INVENTION

Figure 3:
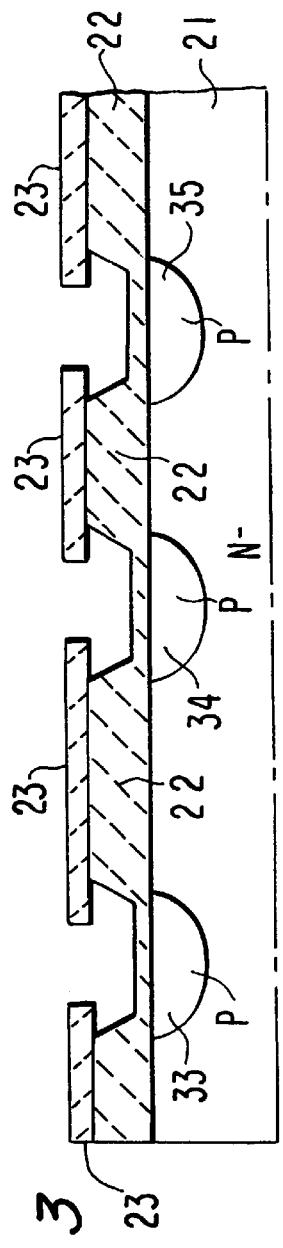
FIG. 3 shows the structure of FIG. 2 after a diffusion drive.

Referring first to FIG. 1, there is shown the first steps for a novel process for making a FRED device in a monocrystalline silicon wafer 20 wherein only a single mask step is used. Only a small part of the wafer is shown and only a portion of a die which is sawn from the wafer is shown. In subsequent figures, the same numerals identify similar elements.

The wafer 20 may be an N$^+$ wafer, having an N$^-$ epitaxially deposited layer 21 for receiving P diffusions and Schottky contacts.

The first main process step is the formation of a continuous silicon dioxide layer 22 (a grown oxide) having a thickness of about 14,000 Å followed by the deposition of a continuous silicon nitride layer 23, having a thickness of about 3,000 Å. Note that the thicknesses shown in the drawings are not to scale, for purposes of clarity.

A layer 24 of photoresist is then deposited atop silicon nitride layer 23. Windows 25, 26 and 27 are then opened in photoresist 24 in the single mask and photolithographic step employed for the process of FIGS. 1 to 5. The windows may have any desired topology. For example, window 25 which is used to form a guard ring diffusion may be a closed annular ring, while windows 26 and 27 may be parallel stripes. If desired, windows 26 and 27 may be segments of one of a large plurality of closed polygonal or hexagonal annuli.

The silicon nitride layer 23 exposed by windows 25, 26 and 27 is next etched down to oxide layer 22 by a suitable nitride etch, and the exposed oxide is then etched and undercut (if a wet etch is used), by a suitable oxide etch, to the surface of silicon 21 as shown in FIG. 2. Note that a dry plasma etch, with no undercut, can also be used. A boron implant, for example, 1E14 at 80 kev is then applied to the wafer and P type boron implants 30, 31 and 32 are formed in the silicon surface 21, their boundaries controlled by the "shadow" of windows 25, 26 and 27.

As next shown in FIG. 3, the photoresist layer 24 is stripped away and the boron implants 30, 31 and 32 are driven at 1150° C. for 4 hours, forming P diffusions 33, 34 and 35 respectively.

Figure 4:
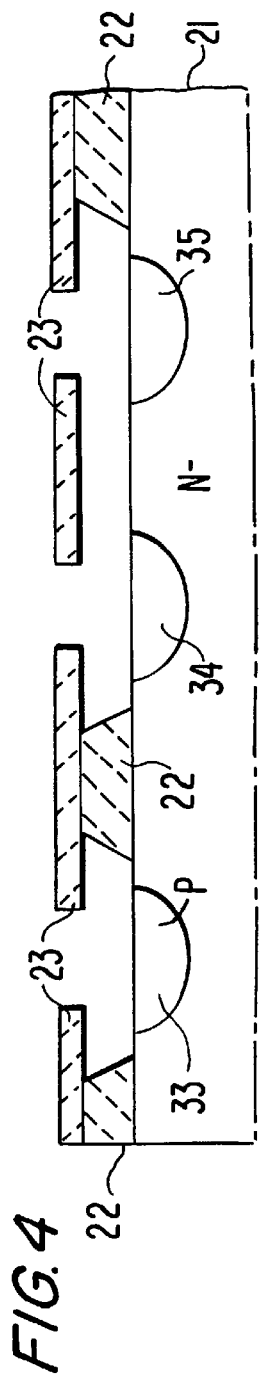
FIG. 4 shows the structure of FIG. 3 after an oxide etch.

As next shown in FIG. 4, a wet oxide etch is carried out, laterally etching oxide layers 22 which are exposed through the windows in the nitride 23. The oxide bridge between diffusions 34 and 35 is only about 6 to 8 microns wide and is fully etched away (as are all other identical regions over the active surface of the device).

Figure 5:
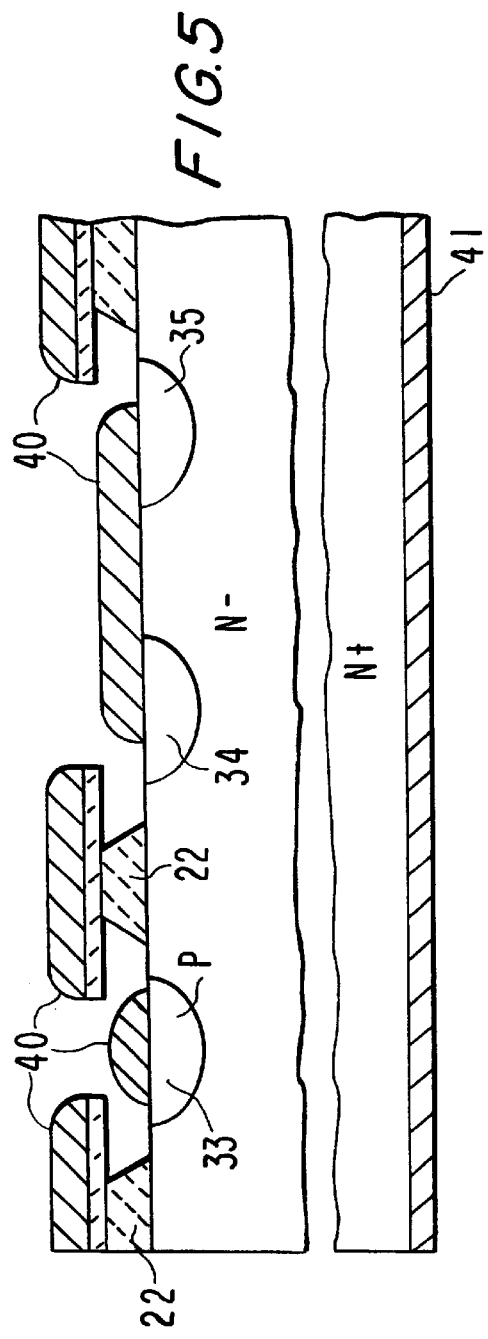
FIG. 5 shows the structure of FIG. 4 after metallization to form PN junction diodes, Schottky diodes and a metallized guard ring.

The unsupported nitride layer then floats off the wafer or is otherwise removed, as shown in FIG. 5. A metal layer 40, usually aluminum, is then deposited atop the full upper surface to a thickness of about 2–3 microns, overlying the remaining oxide barriers 22 and overlying nitride layers and contacting the exposed regions 33, 34 and 35 and the N silicon exposed between them.

The contact of electrode 40 to P regions 34 and 35 defines PN diodes. The contact of electrode 40 to the N$^+$ silicon 21 defines Schottky diodes. Thus, a FRED device is defined. The metal 40 also contacts the P guard ring 33 which acts as a termination for the device.

Thereafter, a back-grind is carried out, thinning wafer 20 to a total thickness of about 300 microns.

A back metal 41 (FIG. 5) is then evaporated on the back side and is exposed to a forming gas anneal.

The novel device of FIG. 5 is manufactured with only a single mask step. FIGS. 6A to 6F show the steps for manufacture of an improved termination which employs field plates and provides a separate termination ring to ground to permit the use of the device at a higher voltage, for example, 1200 volts. It should be noted that the termination to be described in connection with FIGS. 6A to 6F can be used for the FRED device of FIG. 5, but can also be used for any high voltage semiconductor device, such as a power MOSFET, IGBT or the like. However, in FIGS. 6A to 6F the termination employs the basic process steps of FIGS. 1 to 5 with only one added mask.

Referring first to FIG. 6A, the N$^+$ body receives the same oxide layer 22, nitride layer 23, and photoresist 24 as in FIG. 1. However, the first mask of FIG. 1 is modified to provide windows 60 and 61 which will define spaced guard rings, and windows 62, 63 and 64 (and others, not shown) to define the device active area, whether FRED, MOSFET or the like.

In the next process step, shown in FIG. 6B, a boron implant (as in FIG. 1) is applied through the opened windows 60 to 64, to implant boron regions 65 to 69 respectively in the N$^-$ silicon surface.

Figure 6C:
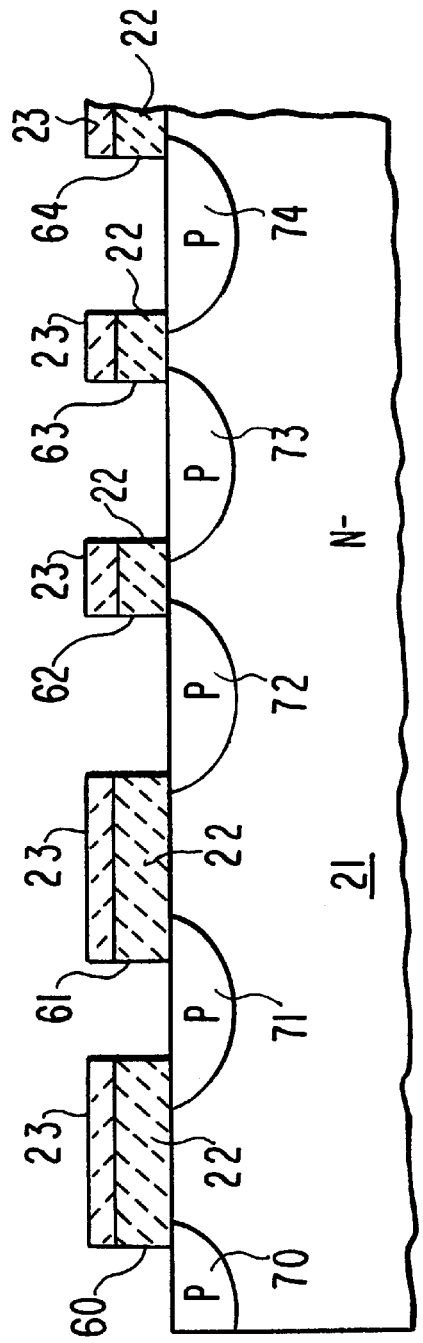

In the next process step, and as shown in FIG. 6C, the photoresist 24 of FIG. 6B is stripped and the boron implants are diffused to form spaced P diffusions 70 to 74.

Figure 6D:
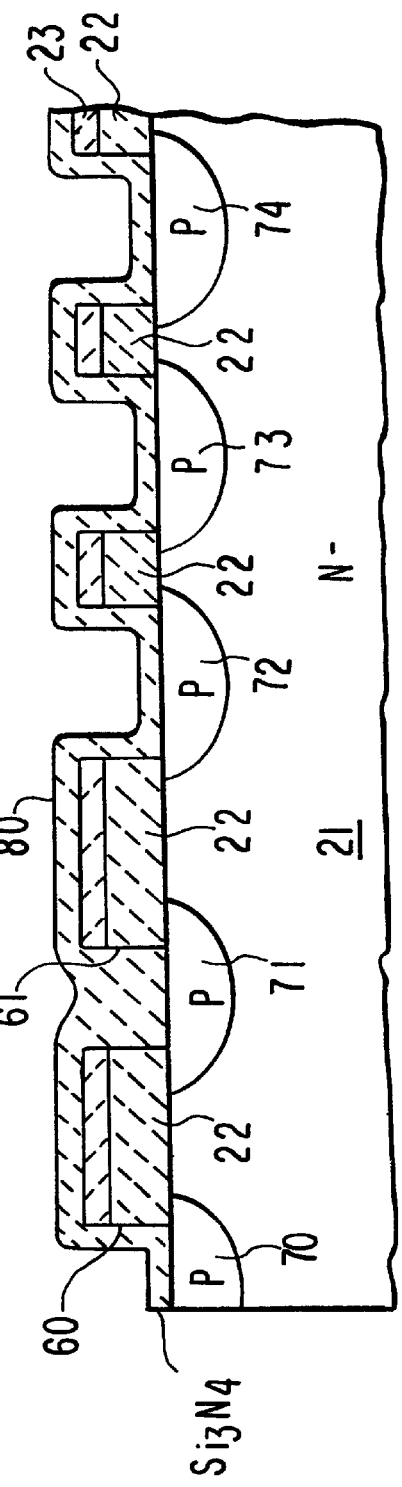

Next, as shown in FIG. 6D, a silicon nitride layer 80 is deposited atop the surface of the wafer, also filling window 61.

Figure 6E:
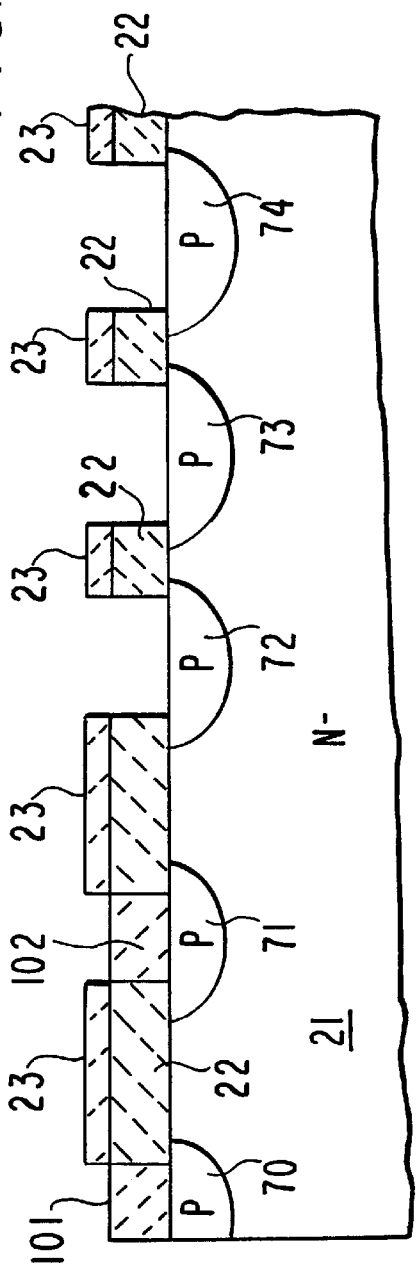

Next, as shown in FIG. 6E, a nitride etch takes place removing the excess top surfaces of nitride layer 80 and the side walls of nitride layer 80, leaving the very narrow nitride "plugs" 101 and 102 in place, and leaving original portions of nitride layer 23 in place.

The purpose of these process steps is to keep the diffused layer in window 61 covered, but to clear the window 62, 63, 64 (FIG. 6C). When nitride is deposited in the step of FIG. 6D, the nitride grows from both sides of opening 61 so that this window is first filled and then grows vertically. The etch process in FIG. 6E is a vertical plasma etch and therefore, must etch the entire nitride layer thickness before reaching the silicon. When the etch is half way through the nitride in window 61, the entire nitride layer in the active area is fully etched away; and a subsequent oxide etch process can remove oxide in the active area while the oxide adjacent window 61 remains protected by nitride.

Thus, a wet oxide etch process is used to undercut the oxides under the nitride segments 23, completely removing all oxide in the active region.

Figure 6F:
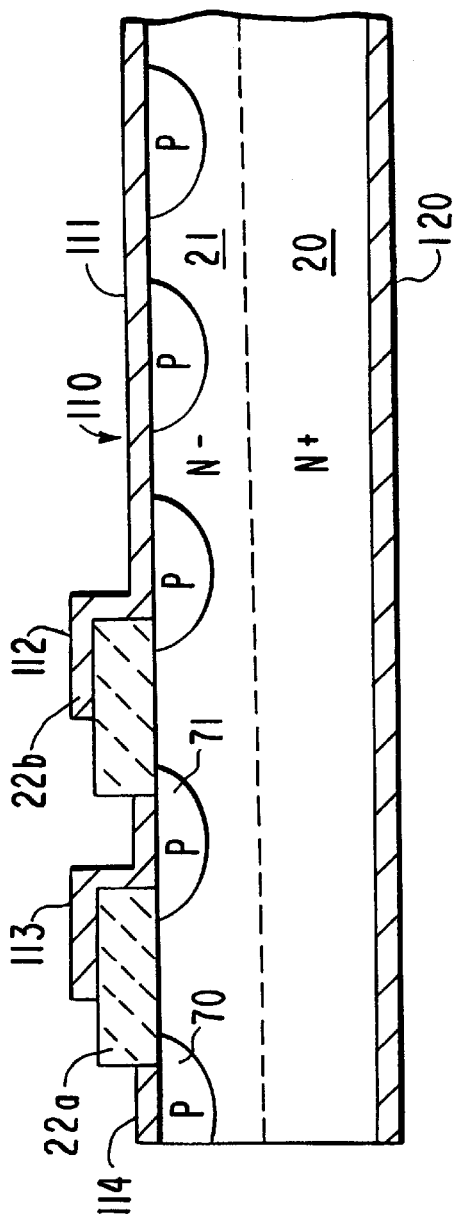

The remaining nitride is next etched away, exposing the full active silicon surface and the oxide strips 22a and 22b in FIG. 6F.

The top surface in FIG. 6F then receives a top metal layer 110. A second mask is then used to pattern the layer 110, leaving in place, the active top metal section 111 and its field plate 112 overlapping oxide (strips 22b), a spaced, insulated field plate 113 which contacts diffusion 71 and which overlaps oxide strip 22a and the ground contact 114, in contact with diffusion 33. The wafer may then be completed with a conventional back-side grind, back contact 120 metallizing, irradiation and anneal.

Figure 7:
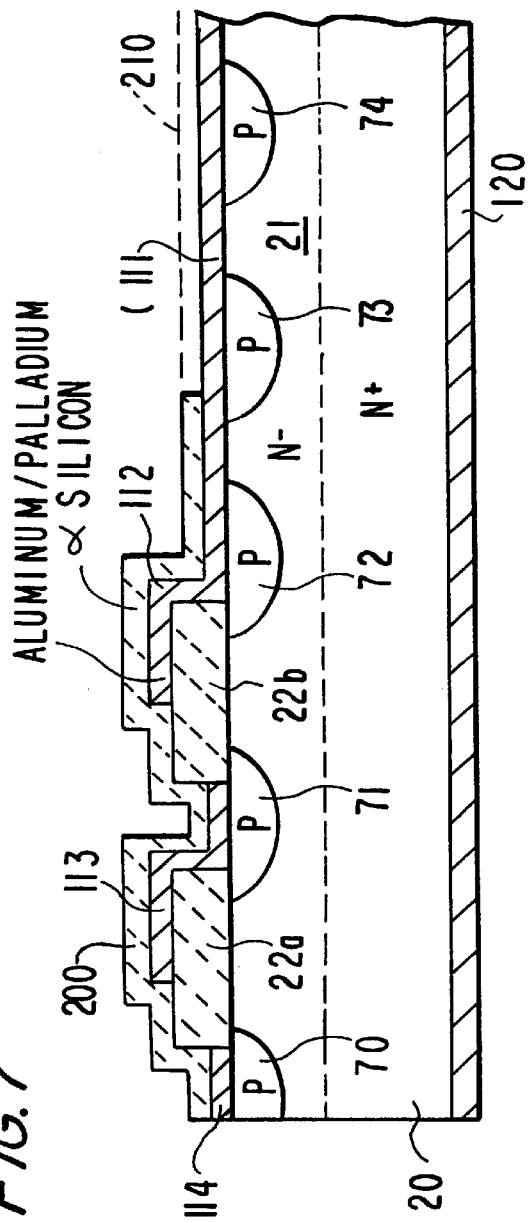
FIG. 7 shows a further improvement of the termination structure of FIG. 6F in which a thin layer of amorphous silicon overlies the top metal of the device.

It has next found possible and desirable, as shown in FIG. 7, to add a thin high resistivity layer (about 1000 Å) of amorphous silicon 200 atop the surface of the structure of FIG. 6F.

Thus, in general, all high voltage devices can beneficially employ the novel field plates 112 and 113 to increase device breakdown voltage for a given termination structure design. The thin layer of high resistivity amorphous silicon 200 will tend to more evenly distribute the electric field laterally across the termination structure. This results in a more stable termination structure and improves yield. If desired, and as shown in dotted line 210, an added mask can be employed to remove amorphous silicon from atop the top active contact layer 111. Alternatively, it is possible to bond connection wires directly through the amorphous silicon as described in U.S. Pat. No. 5,523,604.

Figure 8:
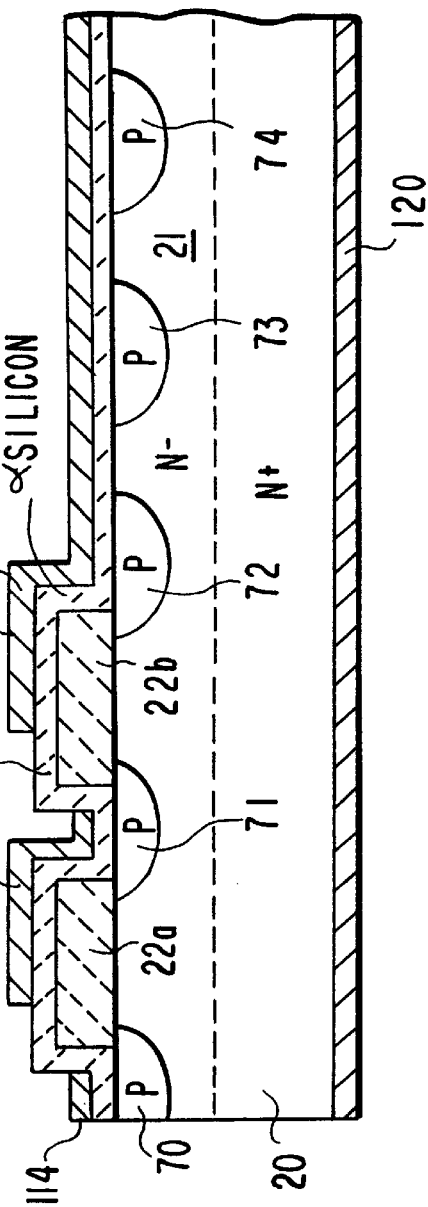
FIG. 8 shows a further improvement of the structure of FIG. 7 in which the amorphous silicon layer underlies the top contact metal.

An alternative to the structure of FIG. 7 is shown in FIG. 8 in which the amorphous silicon layer 200 and aluminum contact layers 111, 112, 113, 114 are deposited in reverse order. Thus, layer 200 will underlie the contact layers 111, 112, 113 and 114. This process and structure have the advantage that the mask step to remove amorphous silicon segment 210 is eliminated and the top contact 111 is directly available for wire bond connection.

It should be noted that the novel sequence, employing amorphous silicon beneath the contact metal can be used for devices other than the illustrative FRED devices and the benefits of the amorphous layer are retained without needing an added mask to expose the top contact for connection to wire bonds. For example, it could reduce a conventional 6 mask process for the manufacture of an IGBT to a 5 mask process with manufacturing yields greater than 80%.

The contact metal 40 in FIG. 5 and contact metal 110 in FIGS. 6F, 7 and 8 are conventionally aluminum. In accordance with a further novel feature of this application, and particularly for the manufacture of a novel FRED structure, the Schottky metal can be a lower barrier height metal than aluminum, and can, for example, be palladium silicide. An aluminum top metal will be deposited atop the palladium silicide. This will then produce a novel ultra low $I_{rr}$ FRED device. A FRED device with these characteristics are very useful for power factor control diodes (because of reduced "ring").

More specifically, the FRED device structure is a hybrid of Schottky and PN junction structure. This arrangement provides, in the final device, a combination of lower forward voltage drop at higher currents, due to minority carrier injection from the PN junctions and higher switching speed due to the presence of majority carriers from the Schottky structures during forward conduction. The stored charge results from injected minority carriers which must be removed after device turn-off. The stored charge removal determines the switching characteristics of a FRED device, particularly switching speed and "softness". A large stored charge also exerts excessive electrical stress during turn-off. Thus, stored charge should be as low as possible.

Figure 9:
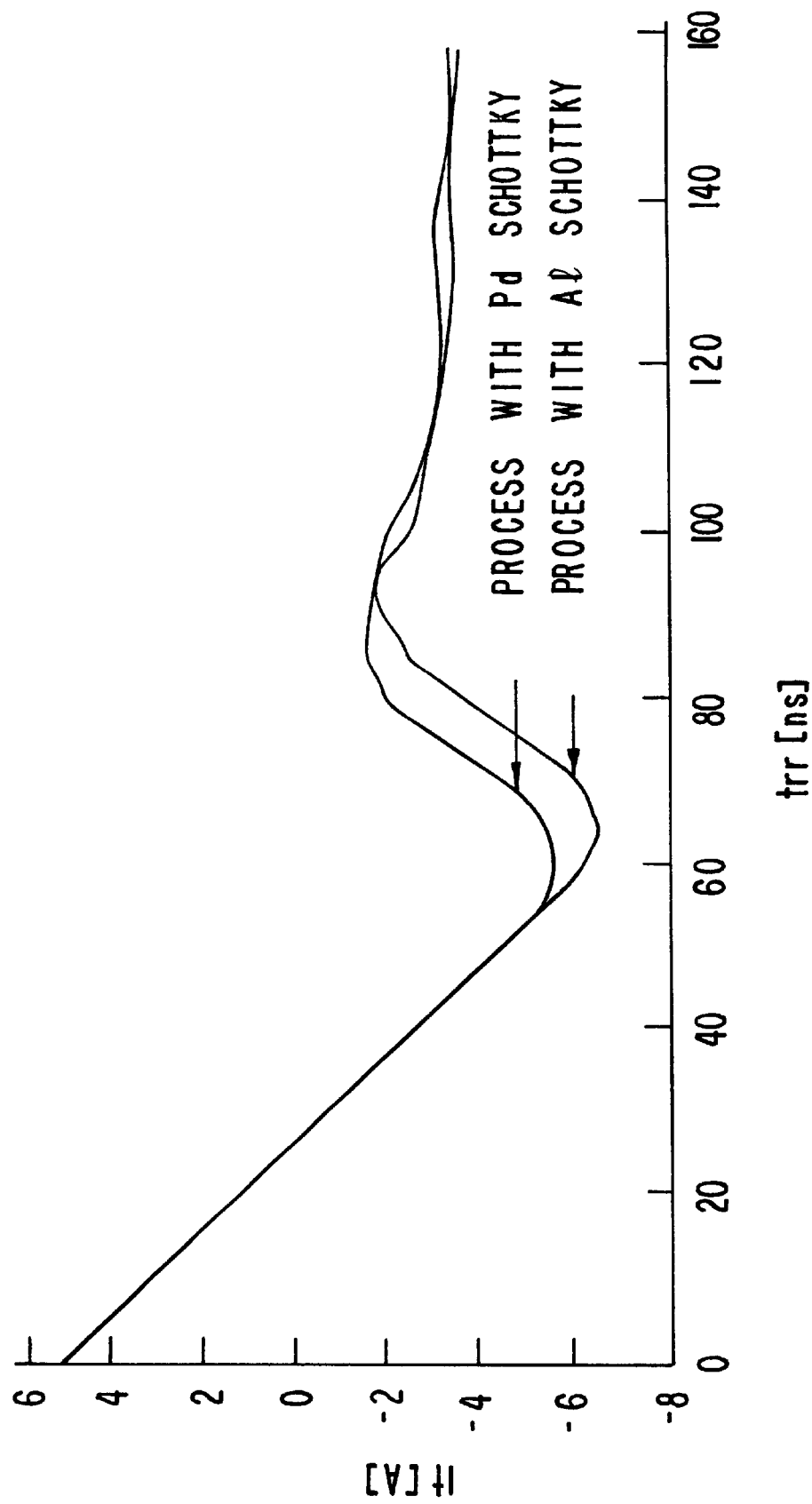
FIG. 9 shows the improved $I_{rr}$ obtained when using a Palladium contact for a FRED device.

The desired improvement can be obtained by controlling the injection of majority carriers. The palladium silicide based Schottky, instead of the traditional aluminum will require a different current density to turn on the PN junction because of its lower Schottky barrier height. While this has no effect on forward voltage drop, it has been found to have a dramatic impact on the stored charge in the device during device operation. This effect is shown in FIG. 9, which shows recovery wave forms for a FRED device, such as that of FIG. 7, rated at 40 amperes and 600 volts, with a palladium silicide Schottky contact, as compared to the equivalent device with an aluminum contact. FIG. 9 shows the improvement in switching speed and a dramatic reduction in $I_{rr}$ (which is a measure of stored charge) and device "softness" resulting from the use of the lower barrier Schottky metal.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

We claim:

1. The process of manufacture of a FRED device comprising the steps of (a) forming an insulation oxide layer atop the surface of a monocrystalline N type silicon wafer;

(b) forming an insulation nitride layer atop the surface of said oxide layer wherein the insulation nitride layer is thinner than the insulation oxide layer;

(c) forming a photoresist layer atop said insulation nitride layer;

(d) applying a photolithographic mask to said photoresist layer and forming a plurality of windows in said photoresist layer which define geometry and at least two spaced PN junction segments;

(e) sequentially opening windows in said nitride layer and said oxide layer by etching through said windows in said photolithographic mask ;

(f) implanting a P type impurity through said window openings in at least said nitride layer and the silicon surface portions underlying said openings;

(g) heating said wafer to diffuse said implanted P type impurities into said silicon and laterally with respect to said silicon surface, to define at least two active area diffusions spaced from one another beneath a portion of said oxide layer;

(h) fully laterally etching and removing said portion of said oxide layer, thereby to expose the silicon surface which contains said spaced P diffusions and the N type silicon surface which spans between said spaced P diffusions;

(i) applying a continuous top metal layer over the said exposed silicon surface to make contact to said P diffusions and to said N type surface spanning between said P diffusions, thereby forming a Schottky contact to said silicon and a PN diode contact to said spaced P diffusions;

(j) and applying a bottom metal contact to the bottom surface of said silicon wafer.

2. The process of claim 1 wherein said spaced P diffusions are parallel stripes.

3. The process of claim 1 wherein said spaced P diffusions are segments of an at least one polygonal P type annulus.

4. The process of claim 1 wherein said oxide layer has a thickness of greater than about 10,000 Å and said nitride layer has a thickness less than about 2000 Å.

5. The process of claim 1 wherein said P type impurity is boron.

6. The process of claim 1 wherein said metal layer is aluminum.

7. The process of claim 6 wherein said P type impurity is boron.

8. The process of claim 6 wherein said oxide layer has a thickness of greater than about 10,000 Å and said nitride layer has a thickness less than about 2000 Å.

9. The process of claim 8 wherein said spaced P diffusions are parallel stripes.

10. The process of claim 9 wherein said P type impurity is Boron.

11. The process of claim 1 wherein at least one of said windows defines a guard ring geometry which surrounds said active area diffusions; said top metal layer contacting the surface of the P diffusion defining said guard ring.

12. The process of claim 1 in which said photolithographic mask is the only mask step used in the entire process.

13. The process of claim 9 in which said photolithographic mask is the only mask step used in the entire process.

14. The process of claim 10 in which said photolithographic mask is the only mask step used in the entire process.

15. The process of claim 11 in which said photolithographic mask is the only mask step used in the entire process.

16. The process of claim 9 wherein at least one of said windows defines a guard ring geometry which surrounds said active area diffusions; said top metal layer contacting the surface of the P diffusion defining said guard ring.

17. The process of claim 10 wherein at least one of said windows defines a guard ring geometry which surrounds said active area diffusions; said top metal layer contacting the surface of the P diffusion defining said guard ring.

* * * * *